(12) United States Patent
Nakabayashi

(10) Patent No.: US 10,991,645 B2
(45) Date of Patent: Apr. 27, 2021

(54) WIRING SUBSTRATE

(71) Applicant: SHINKO ELECTRIC INDUSTRIES CO., LTD., Nagano (JP)

(72) Inventor: Yoko Nakabayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/449,878

(22) Filed: Jun. 24, 2019

(65) Prior Publication Data

US 2020/0013708 A1 Jan. 9, 2020

(30) Foreign Application Priority Data

Jul. 3, 2018 (JP) .............................. JP2018-127004

(51) Int. Cl.

| H01L 23/495 | (2006.01) |
|---|---|
| H01L 23/498 | (2006.01) |
| H01L 23/15 | (2006.01) |
| H01L 23/00 | (2006.01) |
| H01L 23/31 | (2006.01) |

(52) U.S. Cl.
CPC ........ H01L 23/49827 (2013.01); H01L 23/15 (2013.01); H01L 23/49866 (2013.01); H01L 24/16 (2013.01); *H01L 23/3157* (2013.01); *H01L 2224/16227* (2013.01)

(58) Field of Classification Search
CPC ......... H01L 23/49827; H01L 23/49866; H01L 23/15
USPC ................................................ 257/701, 774
See application file for complete search history.

(56) References Cited

U.S. PATENT DOCUMENTS

| 5,814,880 A * | 9/1998 | Costello ................ H01L 23/057 257/678 |
|---|---|---|
| 6,175,152 B1 * | 1/2001 | Toyoda ............. H01L 23/49838 257/689 |
| 6,362,436 B1 * | 3/2002 | Kimbara .............. H05K 3/3436 174/260 |
| 8,680,598 B2 * | 3/2014 | Cheng ................. H01L 27/1087 257/301 |
| 9,105,628 B1 * | 8/2015 | Dubin ............... H01L 21/76831 |
| 9,920,432 B2 | 3/2018 | Thomas et al. |
| 2008/0012133 A1 * | 1/2008 | Shih .................. H01L 21/76856 257/751 |
| 2011/0006437 A1 * | 1/2011 | Tsao .................. H01L 21/76831 257/774 |

(Continued)

FOREIGN PATENT DOCUMENTS

| JP | 2007-126743 | 5/2007 |
|---|---|---|
| JP | 2014-143251 | 8/2014 |
| WO | 2013/083600 | 6/2013 |

OTHER PUBLICATIONS

Minoru Hiramatsu et al., "Application of Silane Coupling Treatment to an Electroplated Surface", Journal of the Surface Finishing Society of Japan, vol. 40, No. 3, 1989, pp. 406-411, with English Abs.

*Primary Examiner* — Nitin Parekh
(74) *Attorney, Agent, or Firm* — IPUSA, PLLC

(57) ABSTRACT

A wiring substrate includes: a substrate; an oxide film including an oxide of one or both of Ti and Zr, the oxide film being formed on a surface of the substrate; an alloy film including an alloy of one or any combination of Ni, Co, and W with Cu, the alloy film being formed on the oxide film; and a Cu layer formed on the alloy film.

6 Claims, 10 Drawing Sheets

(56) References Cited

U.S. PATENT DOCUMENTS

| | | | |
|---|---|---|---|
| 2013/0270703 A1* | 10/2013 | Zierath | H01L 21/76879 257/751 |
| 2014/0077374 A1* | 3/2014 | Lin | H01L 23/481 257/741 |
| 2016/0020168 A1* | 1/2016 | Kao | H01L 21/2633 257/774 |
| 2017/0032978 A1* | 2/2017 | Moriyama | H01L 23/49866 |
| 2017/0047313 A1* | 2/2017 | Yang | H01L 23/49827 |
| 2018/0286797 A1* | 10/2018 | Goh | H01L 23/66 |
| 2019/0259631 A1* | 8/2019 | May | H01L 23/49822 |
| 2020/0013673 A1* | 1/2020 | Zierath | H01L 23/53233 |

\* cited by examiner

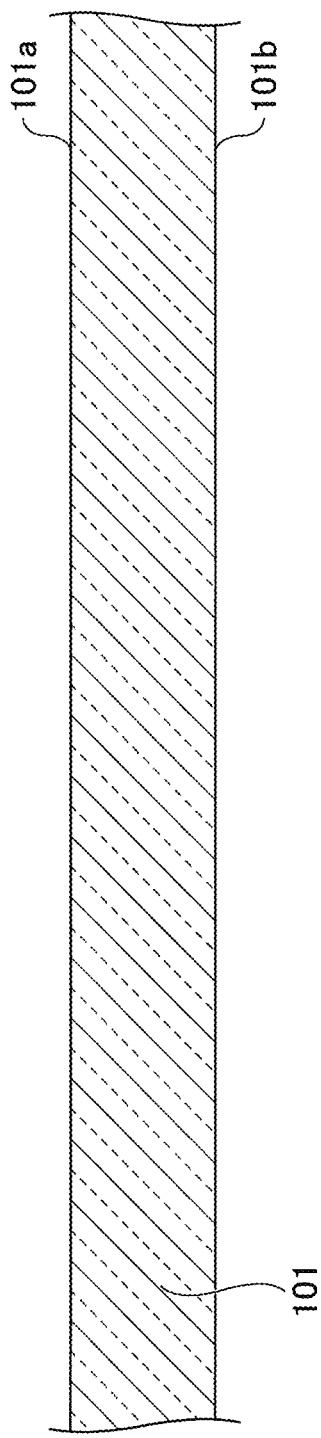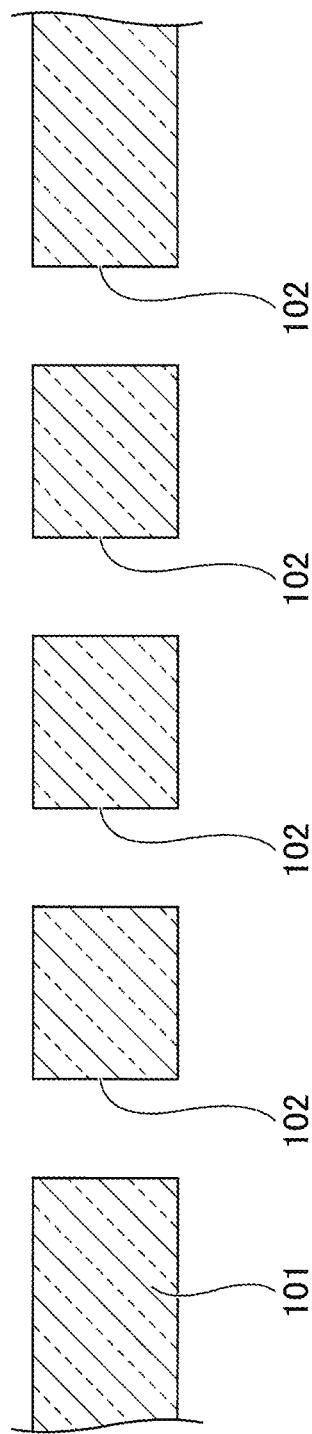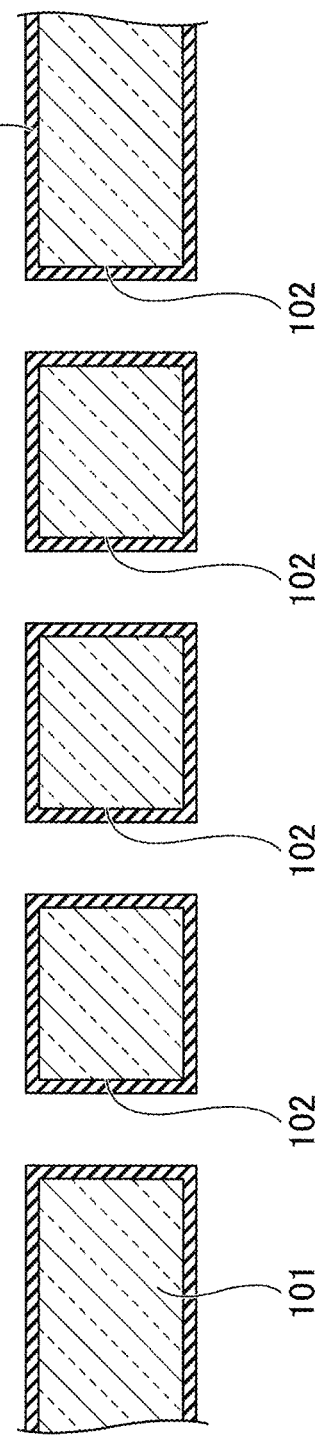

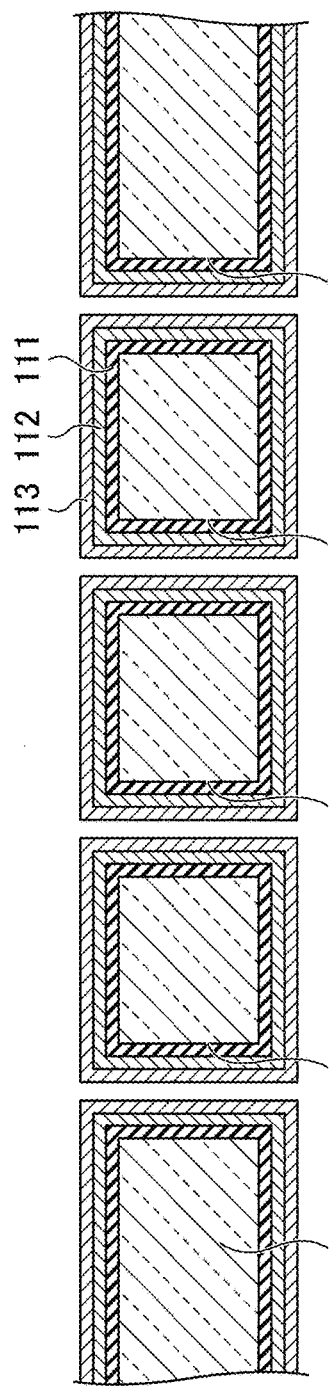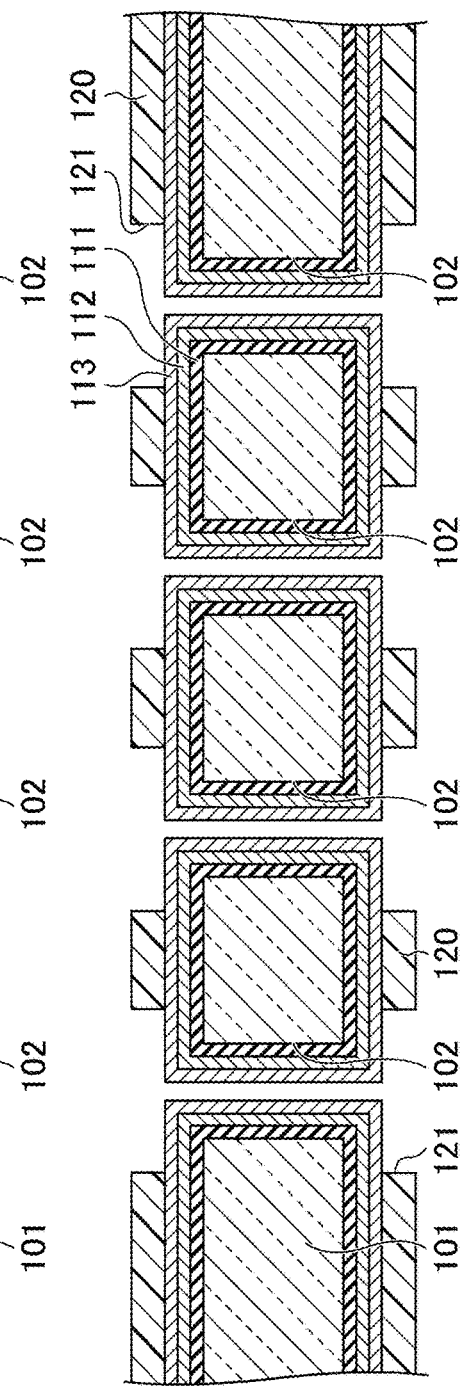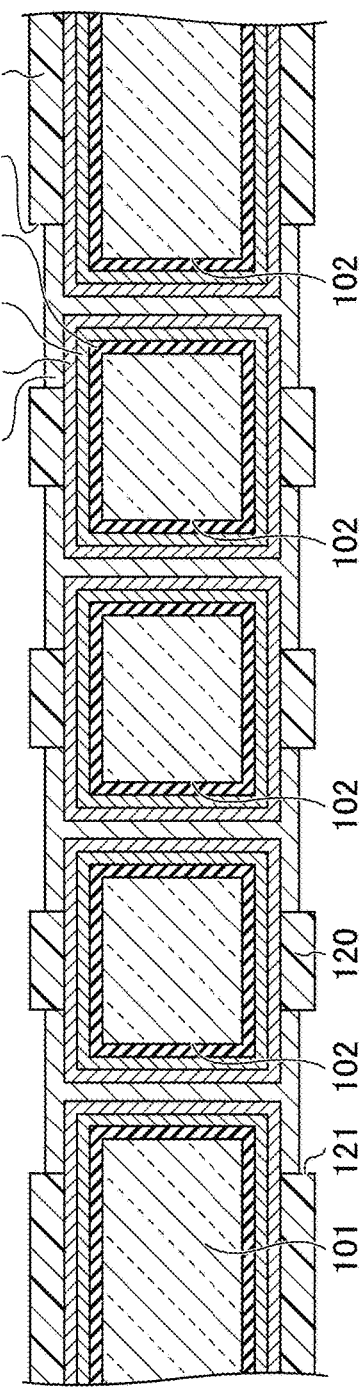

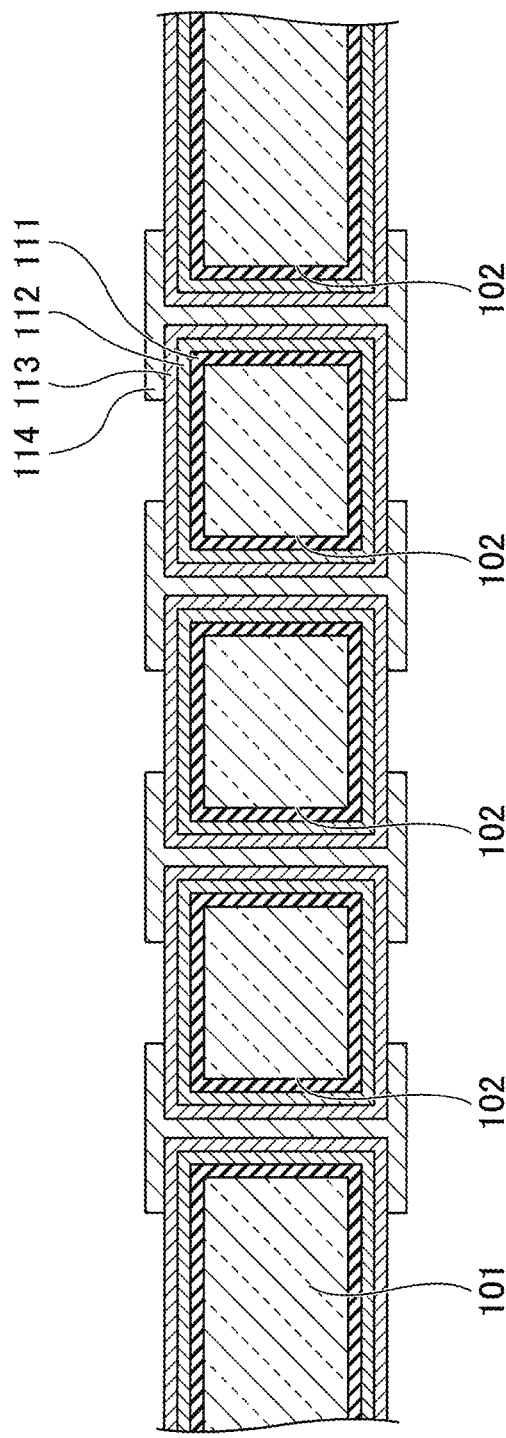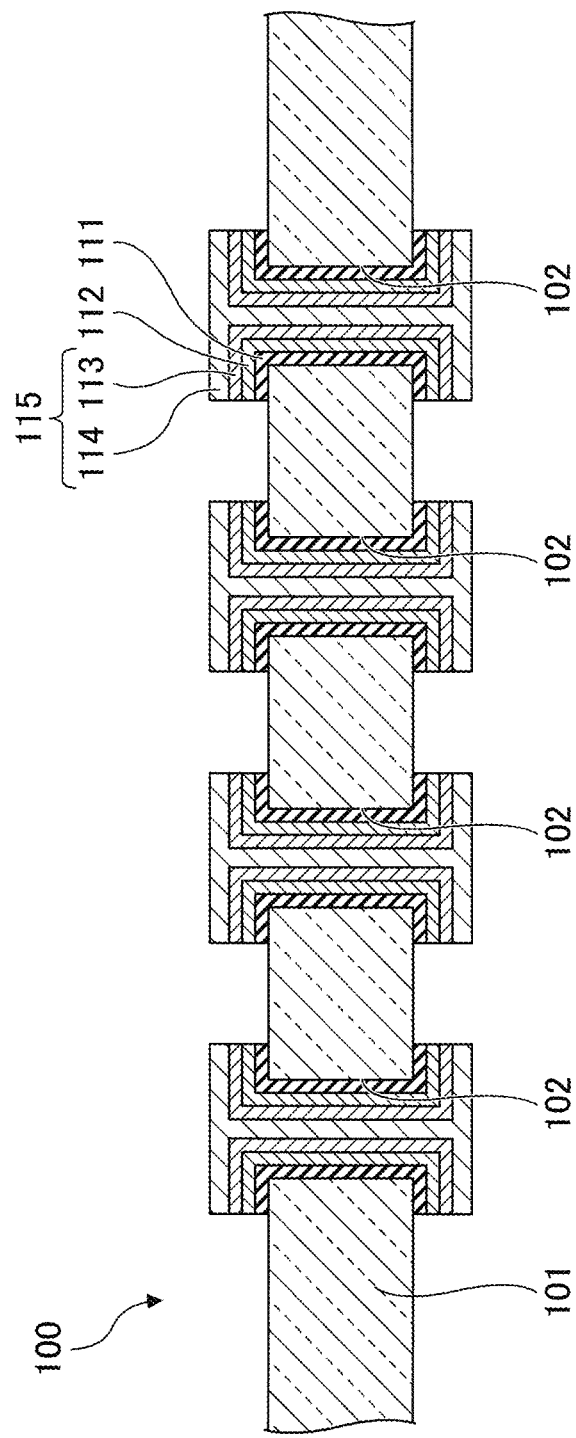
FIG.4A
FIG.4B

WIRING SUBSTRATE

CROSS-REFERENCE TO RELATED APPLICATION

This application is based upon and claims priority to Japanese Patent Application No. 2018-127004, filed on Jul. 3, 2018, the entire contents of which are incorporated herein by reference.

FIELD

The embodiments discussed herein relate to a wiring substrate.

BACKGROUND

There exist interposers using glass substrates. In an interposer, through holes are formed on the substrate, and Cu plating layers formed on the front surface and the back surface of the substrate are connected to each other via conductive material in the through holes.

Various methods are proposed for forming Cu plating layers on glass substrates.

RELATED-ART DOCUMENTS

Patent Documents

[Patent Document 1] Japanese Laid-open Patent Publication No. 2007-126743
[Patent Document 2] International Publication Pamphlet No. WO2013/083600
[Patent Document 3] Japanese Patent No. 5405677

Non Patent Documents

[Non Patent Document 1] Journal of the Surface Finishing Society of Japan 40(3) (1989), Minoru HIRAMATSU and Hitoshi KAWASAKI Methods of forming Cu layers on glass substrates can be roughly divided into a dry system and a wet system. The wet system is more preferable than the dry system in terms of introduction cost of devices. However, conventionally, it is difficult to form a Cu layer with excellent adhesion to a substrate by a wet system.

An object of the present invention is to provide a wiring substrate and a semiconductor package excellent in adhesion between a substrate and a Cu layer.

SUMMARY

According to one aspect, a wiring substrate includes: a substrate; an oxide film including an oxide of one or both of Ti and Zr, the oxide film being formed on a surface of the substrate; an alloy film including an alloy of one or any combination of Ni, Co, and W with Cu, the alloy film being formed on the oxide film; and a Cu layer formed on the alloy film.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIGS. 2A to 2C are cross-sectional views illustrating a method of manufacturing a wiring substrate according to a second embodiment (part 1);
FIGS. 3A to 3C are cross-sectional views illustrating the method of manufacturing the wiring substrate according to the second embodiment (part 2);
FIGS. 4A and 4B are cross-sectional views illustrating the method of manufacturing the wiring substrate according to the second embodiment (part 3)

DESCRIPTION OF EMBODIMENTS

Figure 1:
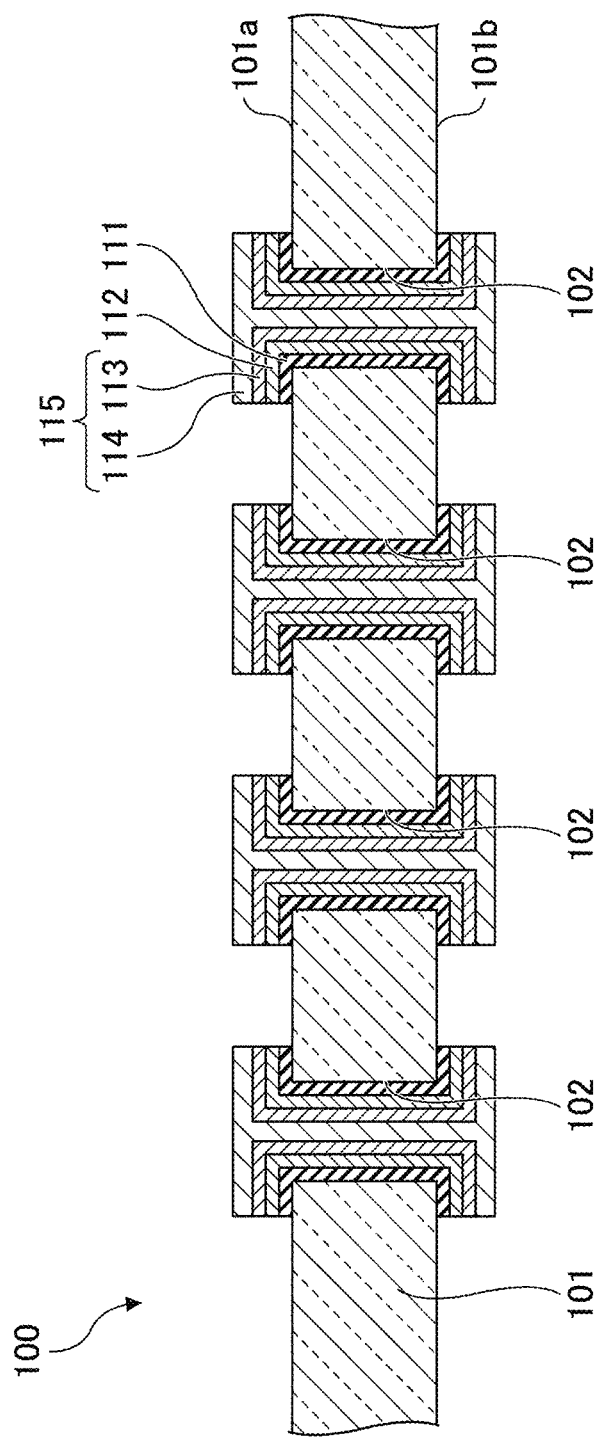
FIG. 1 is a cross-sectional view illustrating an interposer according to a first embodiment.

In the following, embodiments will be described with reference to the accompanying drawings. Note that in the specification and the drawings, substantially same constituent elements may be referred to by the same reference numerals, and duplicate descriptions may be omitted as appropriate.

First Embodiment

First, a first embodiment will be described. The first embodiment relates to an interposer 100, and the interposer 100 is an example of a wiring substrate. FIG. 1 is a cross-sectional view illustrating the interposer 100 according to the first embodiment.

As illustrated in FIG. 1, the interposer 100 according to the first embodiment includes a glass substrate 101 in which a plurality of through holes 102 are formed. For example, the thickness of the glass substrate 101 is in a range of 100 µm to 1000 µm, and the diameter of the through holes 102 is in a range of 10 µm to 100 µm. For example, borosilicate glass is used as a material of the glass substrate 101. Other glass such as quartz glass, alkali-free glass, or the like may be used as the material of the glass substrate 101.

A plurality of interposer areas for obtaining an interposer are defined in the glass substrate 101, and a plurality of through holes 102 are formed in each interposer area. FIG. 1 schematically illustrates one interposer area of the glass substrate 101.

For each of the through holes 102, an oxide film 111 including an oxide of titanium (Ti) or zirconium (Zr) is formed from its side surface to a first surface 101a and a second surface 101b of the glass substrate 101. The second surface 101b is opposite the first surface 101a. For example, the oxide film 111 is formed by aggregation of granular oxide of Ti or Zr in the plane, and relatively large protrusions and recesses are present on the surface of the oxide film 111. The oxide film 111 may be an oxide film including oxide of Ti and Zr. The surface roughness Ra of the oxide film 111 is preferably in a range of 0.5 nm to 2.0 nm.

An alloy film 112 of nickel (Ni), cobalt (Co), or tungsten (W) with Cu is formed on the oxide film 111, an electroless Cu plating layer 113 is formed on the alloy film 112, and an electrolytic Cu plating layer 114 is formed on the electroless Cu plating layer 113. The electroless Cu plating layer 113 and the electrolytic Cu plating layer 114 are included in a Cu plating layer 115. The alloy film 112 may be an alloy film of two or more kinds of Ni, Co, and W with Cu. The alloy film 112 and the Cu plating layer 115 serve as wiring for interposer 100. Also, a signal flows mainly through the Cu plating layer 115.

The coefficient of linear thermal expansion of borosilicate glass that is usable for the glass substrate 101 is $3.68 \times 10^{-6}$ $K^{-1}$ in the temperature range of 20° C. to 350° C. The coefficient of linear thermal expansion of Cu is $15.4 \times 10^{-6}$ $K^{-1}$ in the temperature range of $-103°$ C. to 0° C., $16.2 \times 10^{-6}$ $K^{-1}$ in the temperature range of 0° C. to 101° C., and $17.5 \times 10^{-6}$ $K^{-1}$ at the temperature of 300° C. The coefficient of linear thermal expansion of rutile type Ti oxide ($TiO_2$) is $7.19 \times 10^{-6}$ $K^{-1}$, and the coefficient of linear thermal expansion of Zr oxide ($ZrO_2$) is in a range of $7.9 \times 10^{-6}$ $K^{-1}$ to $11 \times 10^{-6}$ $K^{-1}$.

Accordingly, when a temperature change occurs in the interposer 100, the oxide film 111 serves as a stress relaxation layer between the glass substrate 101 and the Cu plating layer 115 to prevent the Cu plating layer 115 from being peeled off from the glass substrate 101.

Also, because Ni, Co, and W are more easily oxidized than Cu, the alloy film 112 containing Ni, Co, or W adheres more tightly to the oxide film 111 than to the electroless Cu plating layer 113. Accordingly, excellent adhesion can be obtained between the Cu plating layer 115 and the oxide layer 111.

Therefore, according to the interposer 100 according to the first embodiment, excellent adhesion can be obtained between the glass substrate 101 and the Cu plating layer 115.

Further, as will be described in detail below, the formation of the oxide film 111 does not require high-temperature firing required for surface treatment by a sol-gel method. Therefore, the stability of the properties of the glass substrate 101 is favorable.

Second Embodiment

Next, a second embodiment will be described. The second embodiment relates to a method of manufacturing an interposer according to the first embodiment. FIGS. 2 to 4 are cross-sectional views illustrating a method of manufacturing a wiring substrate according to the second embodiment.

First, as illustrated in FIG. 2A, a glass substrate 101 is prepared and a plurality of through holes 102 are formed on the glass substrate 101 as illustrated in FIG. 2B. For example, the through holes 102 may be formed by laser processing or etching processing. In a case where the through holes 102 are formed by etching, for example, a resist (not illustrated) provided with opening portions is formed by photolithography on the glass substrate 101. Then, through the opening portions of the resist, the glass substrate 101 is processed to penetrate by dry etching, such as reactive ion etching (RIE). Thereafter, the resist is removed. A glass substrate 101 on which through holes 102 are formed in advance may be prepared.

Thereafter, as illustrated in FIG. 2C, on the first surface 101a and the second surface 101b of the glass substrate 101 and on the side surfaces of the through holes 102, an oxide film 111 including an oxide of Ti or Zr is formed. The oxide film 111 is formed by, for example, immersing the glass substrate 101 in a coating liquid in which an organometallic complex of Ti or Zr is dissolved in a solvent, extract the glass substrate 101 from the coating liquid, and drying the glass substrate 101 at 100° C. to 160° C. For example, the temperature of the coating liquid may be ambient temperature, and the number of times of immersion may be one to five times.

For example, titanium tetraacetyl acetonate, titanium octylene glycolate, a titanium lactate ammonium salt, and titanium triethanolaminate can be used as organometallic complexes of Ti. The formula of titanium tetraacetylacetonate is $Ti(C_5H_7O_2)_4$. The formula of titanium-octylene glycolate is $Ti(OC_8H_{17})_2(C_8H_{17}O_2)_2$. The formula of titanium lactate ammonium salt is $Ti(OH)_2[OCH(CH_3)COO^-]_2(NH_4^+)_2$. The formula of titanium triethanolaminate is $Ti(O-i-C_3H_7)_2(C_6H_{14}O_3N)_2$. Examples of products including these are ORGATIX TC-401, ORGATIX TC-201, ORGATIX TC-300, and ORGATIX TC-400 of Matsumoto Fine Chemical Co., Ltd. ORGATIX TC-401 contains 65% by weight of titanium tetraacetyl acetonate in a solvent of 2-propanol. ORGATIX TC-201 contains 67% by weight of titanium octylene glycolate in a solvent of 1-butanol. ORGATIX TC-300 contains 41% by weight of titanium lactate ammonium salt in a solvent of 2-propanol and water. ORGATIX TC-400 contains 79% by weight of titanium triethanolaminate in a solvent of 2-propanol. These are exemplary and other organometallic complexes of Ti may be used.

For example, zirconium monoacetylacetonate and a zirconium lactate ammonium salt can be used as organometallic complexes of Zr. The formula of zirconium monoacetylacetonate is $Zr(O-n-C_4H_9)_3(C_5H_7O_2)$. The formula of zirconium lactate ammonium salt is $Zr(OH)[OCH(CH_3)COO^-](NH_4^+)_3$. Examples of products including these are ORGATIX ZC-540 and ORGATIX ZC-300 of Matsumoto Fine Chemical Co., Ltd. ORGATIX ZC-540 contains 45% by weight of zirconium monoacetylacetonate in a solvent of toluene, 1-butanol, and butyl acetate. ORGATIX ZC-300 contains 12% by weight of zirconium lactate ammonium salt in a solvent of water and 1-propanol. These are exemplary and other organometallic complexes of Zr may be used.

As a solvent of the coating liquid, for example, a low boiling point solvent having a boiling point of 200° C. or less is used. Examples of such a solvent include toluene, hexane, ethyl acetate, heptane (n-heptane), methanol, 2-propanol, ethanol (99.5%), cumene (isopropyl benzene), 1-butanol, 3-methoxy-1-propanol, 2-pentanol, 4-methyl-2-pentanol, ethyl valerate (98%), isobutyl isobutyrate, 1,8-nonadiene, 4-pentyl-1-ol, 2-pentylfuran (2-n-amylfuran), pentyl acetate, ethyl pyruvate, 3,5,5-trimethylhexanal, cyclohexanone, 2-methyl-3-hexyn-2-ol, 5-hexen-1-ol, 4-heptanone, 1-pentanol, cyclopentanol, 2-butyn-1-ol, 2-ethoxycyclohexanone, 2-ethyl-1-butanol, 2-acetyl-5-norbornene, α-pinene oxide, 6-methyl-5-hepten-2-ol, α-angelica lactone, 5-hexyn-1-ol, 2-methoxyethanol (methyl cellosolve), 1-acetoxy-2-methoxyethane (2-methoxyethyl acetate), 2-ethoxyethanol (ethyl cellosolve), acetic acid, formic acid, 2-isopropoxyethanol (ethylene glycol monoisopropyl ether), acrylic acid, hydroxyacetone, and acetic acid 2-ethoxyethyl (acetic acid ethylene glycol monoethyl ether).

The coating liquid may contain a surfactant. Examples of such a surfactant include polyethylene glycol, polyoxyethylene lauryl ether (Brij (registered trademark)), polypropylene glycol, PEG (polyethylene glycol)-PPG (polypropylene glycol)-PEG, and acetylene-based surfactants. Examples of products of acetylene-based surfactants include Surfynol 104PG-50, Surfynol 465, Surfynol 61, Surfynol 440, Surfynol SE-F, Dynol 604, Orfine WE-003, and Olfine PD-201 of Nissin Chemical Industry Co., Ltd.

For example, the content of the organometallic complex of Ti or Zr in the coating liquid is in a range of 0.1% by volume to 10% by volume, and the content of the surfactant is in a range of 0.01% by volume to 1% by volume. The coating liquid may contain a thickener in a range of 0.1% by weight to 10% by weight. Examples of such a thickener include glycerin and xanthan gum.

Figure 5:
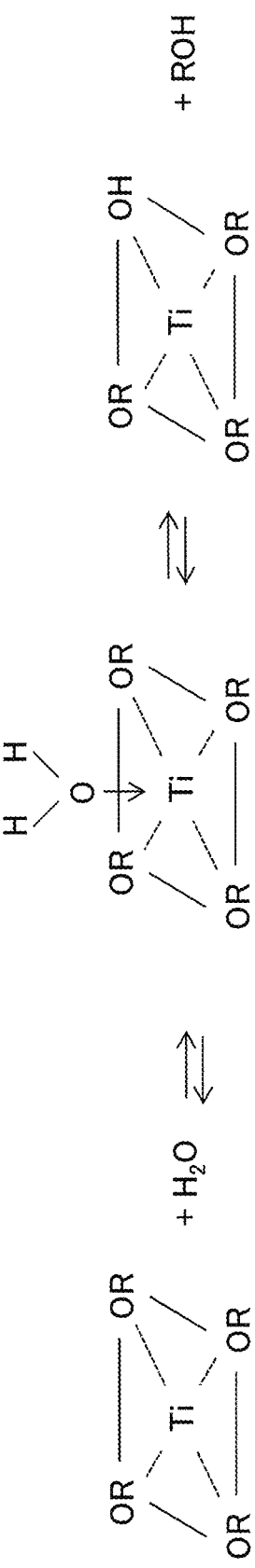
FIG. 5 is a diagram illustrating a chemical reaction in a case where an organometallic complex of Ti is used (part 1)
Figure 6:
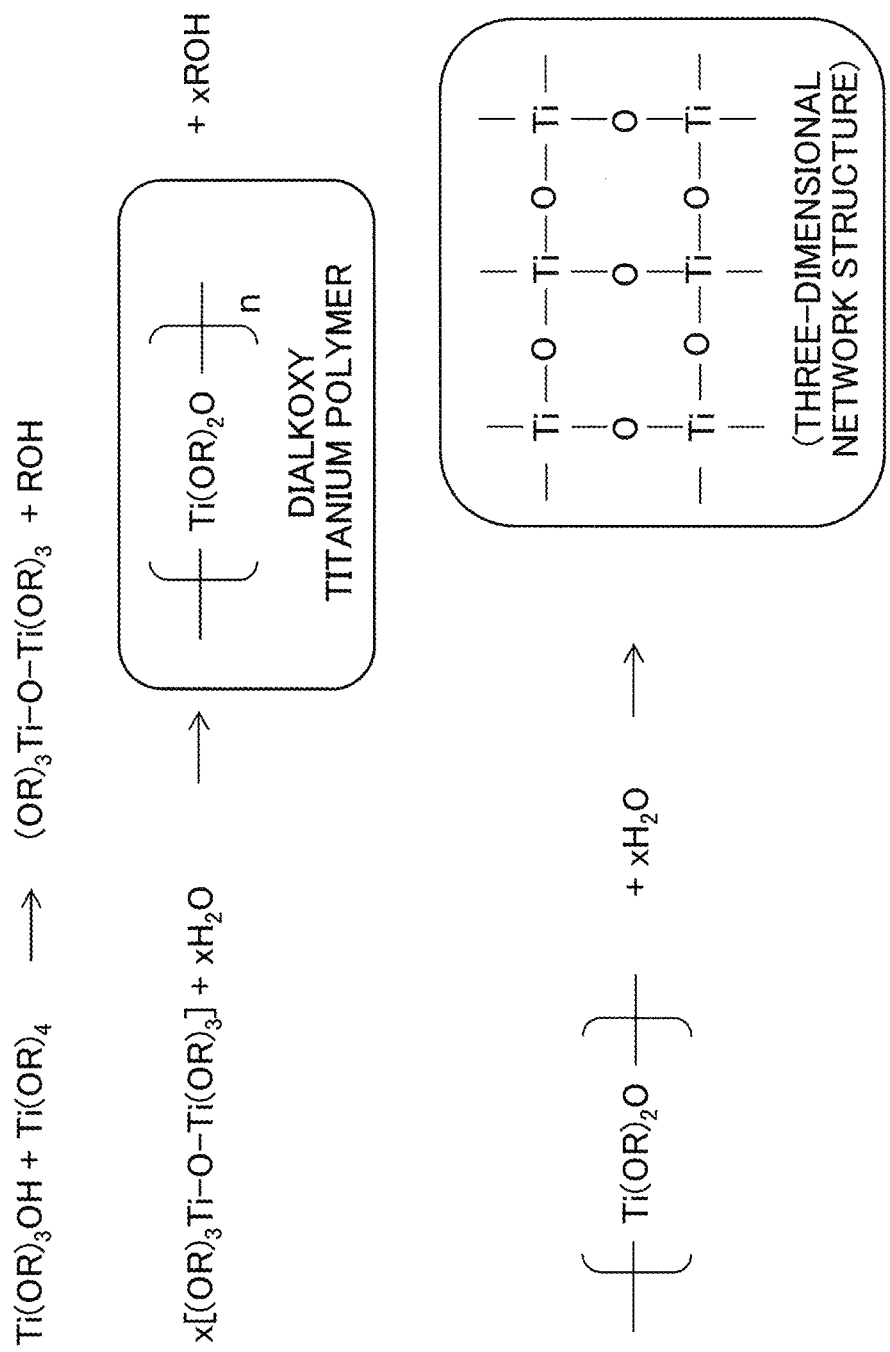
FIG. 6 is a diagram illustrating a chemical reaction in a case where an organometallic complex of Ti is used (part 2)
Figure 7:
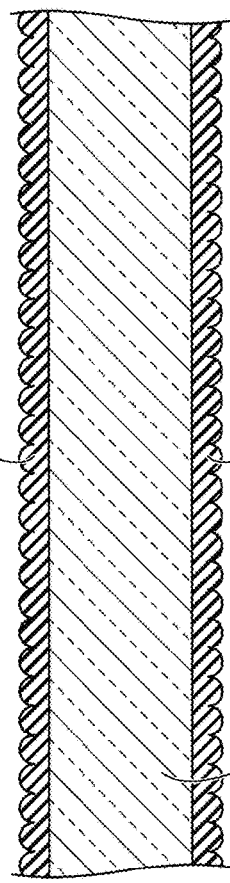
FIG. 7 is a cross-sectional view illustrating an oxide that is formed using an organometallic complex of Ti.

Here, a chemical reaction in a case where an organometallic complex of Ti is used will be described. FIG. 5 and FIG. 6 are diagrams illustrating a chemical reaction in a case where an organometallic complex of Ti is used. FIG. 7 is a cross-sectional view illustrating an oxide film 111 that is formed using an organometallic complex of Ti.

At the time of drying at 100° C. to 160° C., first, hydrolysis illustrated in FIG. 5 occurs and a product represented by $Ti(OR)_3OH$ is obtained. R is an alkyl group. Next, a reaction of condensation polymerization illustrated in FIG. 6 occurs, and a Ti oxide having a three-dimensional network structure is obtained. That is, an oxide film 111 that includes an oxide of Ti is formed. The oxide film 111, which includes the oxide of Ti and which is formed through the hydrolysis and the condensation reaction, is formed by, for example, aggregation of granular Ti oxide in the plane, and relatively large protrusions and recesses are present on the surface of the oxide film 111 as illustrated in FIG. 7. The surface roughness Ra of the oxide film 111 is preferably in a range of 0.5 nm to 2.0 nm.

Although FIG. 5 and FIG. 6 indicate the chemical reactions in a case where an organometallic complex of Ti is used, in a case where an organometallic complex of Zr is used, similarly, an oxide film 111 including an oxide of Zr is formed through hydrolysis and a condensation reaction. Also, on the surface of the oxide film 111 including an oxide of Zr formed through the hydrolysis and the condensation reaction, relatively large protrusions and recesses are present. The coating liquid may include both an organometallic complex of Ti and an organometallic complex of Zr.

In this manner, the oxide film 111 can be formed.

For example, the thickness of the oxide film 111 is in a range of 5 nm and 50 nm. If the thickness of the oxide film 111 is less than 5 nm, there is a possibility that the difference in the amount of thermal deformation between the Cu plating layer 115 and the glass substrate 101 cannot be sufficiently alleviated. If the thickness of the oxide film 111 exceeds 50 nm, the thickness of the oxide film 111 may vary.

After forming the oxide film 111, a catalyst is applied to the surface of the oxide film 111. For example, metal palladium (Pd) is used as the catalyst. In the application of metal Pd, for example, after surface treatment with an organometallic complex of Pd is performed, Pd is reduced. As a catalyst, metal Au or metal Ag may be used instead of metal Pd. Metal Au or metal Ag may also be applied in a similar manner.

Next, as illustrated in FIG. 3A, using an electroless Cu plating solution containing Ni, Co, or W, an alloy film 112 including an alloy of Ni, Co, or W with Cu is famed on the oxide film 111 and an electroless Cu plating layer 113 is formed on the alloy film 112. An example of the electroless Cu plating solution includes the substances listed in Table 1 below.

TABLE 1

| SUBSTANCE | CONCENTRATION |
|---|---|
| COPPER SULFATE PENTAHYDRATE | 5~8 g/L |
| NICKEL (II) SULFATE HEXAHYDRATE | 0.8~2.5 g/L |
| SODIUM POTASSIUM TARTRATE | 15~30 g/L |
| 33% SODIUM HYDROXIDE | 6~12 mL/L |
| 2,2-BIPYRIDYL | 5~50 mg/L |
| 35% FORMALDEHYDE SOLUTION | 3~10 mL/L |
| POLYETHYLENE GLYCOL 4,000 | 0~5 g/L |

Copper sulfate pentahydrate is a main material of the electroless Cu plating layer 113. Nickel (II) sulfate hexahydrate is a material of the alloy film 112 with copper sulfate pentahydrate. Sodium potassium tartrate is a Cu ion complexing agent. The 33% sodium hydroxide is a pH modifier (alkaline agent). 2,2-bipyridyl is a stabilizer. The 35% formaldehyde solution is a reducing agent. Polyethylene glycol (PEG) 4,000 is a surfactant.

In this electroless Cu plating process, for example, the temperature of the electroless Cu plating solution is set to be in a range of 30° C. to 38° C., and the pH of the electroless Cu plating solution is set to be 12 or more, and the plating time is set to be in a range of 15 minutes to 40 minutes.

In a case where the electroless Cu plating solution contains nickel (II) sulfate hexahydrate, an alloy film 112 including an alloy of Ni and Cu is formed and thereafter an electroless Cu plating layer 113 is formed. Ni may be included in the electroless Cu plating layer 113.

Here, an oxidation reaction of formaldehyde in the electroless Cu plating process will be described.

In an alkaline solution containing formaldehyde (HCHO), equilibrium reactions indicated by the following equations (1) and (2) occur.

$$HCHO + H_2O \rightleftharpoons CH_2(OH)_2 \tag{1}$$

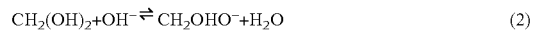
$$CH_2(OH)_2 + OH^- \rightleftharpoons CH_2OHO^- + H_2O \tag{2}$$

Also, the elementary steps of the oxidation reaction are represented by the following equations (3) and (4). The reaction of the equation (3) is a dehydrogenation reaction, and the reaction of the equation (4) is an oxidation reaction.

$$CH_2OHO^- \rightarrow \cdot CHOHO^- + \cdot H \tag{3}$$

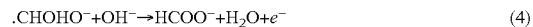
$$\cdot CHOHO^- + OH^- \rightarrow HCOO^- + H_2O + e^- \tag{4}$$

In the present embodiment, the alloy film 112 includes Ni, and on this alloy film 112, an oxidation reaction indicated by the following equation (5) occurs.

$$\cdot H + OH^- \rightarrow H_2O \tag{5}$$

Therefore, the total reaction equation of the oxidation reaction is represented by the following equation (6).

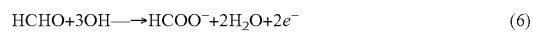
$$HCHO + 3OH^- \rightarrow HCOO^- + 2H_2O + 2e^- \tag{6}$$

The liquid water ($H_2O$) resulting from this oxidation reaction is discharged out of the electroless Cu plating layer 113 without being taken into the electroless Cu plating layer 113.

In a case where cobalt (II) sulfate heptahydrate is used instead of nickel (II) sulfate hexahydrate, an alloy film 112 including an alloy of Co and Cu is formed, and thereafter an electroless Cu plating layer 113 is formed. On the alloy film 112 including the alloy of Co and Cu, the oxidation reaction indicated by the equation (5) occurs, and the total reaction equation of the oxidation reaction is represented by the equation (6). The liquid water (H₂O) resulting from this oxidation reaction is discharged out of the electroless Cu plating layer 113 without being taken into the electroless Cu plating layer 113. Co may be included in the electroless Cu plating layer 113.

In a case where potassium tungstate or tungsten oxide is used instead of nickel (II) sulfate hexahydrate, an alloy film 112 including an alloy of W and Cu is formed, and thereafter an electroless Cu plating layer 113 is formed. On the alloy film 112 including the alloy of W and Cu, the oxidation reaction indicated by the equation (5) occurs, and the total reaction equation of the oxidation reaction is represented by the equation (6). The liquid water (H₂O) resulting from this oxidation reaction is discharged out of the electroless Cu plating layer 113 without being taken into the electroless Cu plating layer 113. W may be included in the electroless Cu plating layer 113.

The electroless Cu plating solution may contain two or more materials of Ni, Co, and W. In this case, the alloy film 112 is an alloy film including an alloy of the two or more of these metal elements with Cu. The electroless Cu plating layer 113 may contain two or more of these metal elements.

Note that an electroless Cu plating layer can also be formed using an electroless Cu plating solution obtained by removing nickel (II) sulfate hexahydrate from the ingredients listed in Table 1. However, the alloy film 112 is not formed before the electroless Cu plating layer is formed. Therefore, the electroless Cu plating layer is formed on the oxide film 111. In this case, although the reactions indicated by the equation (1) to the equation (4) occur, the oxidation reaction indicated by the equation (5) does not occur but the reaction indicated by the following equation (7) occurs. That is, recombination of hydrogen occurs.

$$.H + .H \rightarrow H_2 \qquad (7)$$

Therefore, the total reaction equation of the oxidation reaction in this case is represented by the following equation (8).

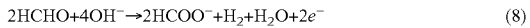

$$2HCHO + 4OH^- \rightarrow 2HCOO^- + H_2 + H_2O + 2e^- \qquad (8)$$

Thus, gaseous hydrogen (H₂) is generated and eutectoid of H₂ occurs in the electroless Cu plating layer. The electroless Cu plating layer in which eutectoid of H₂ occurs causes a compressive stress in the electroless Cu plating layer during annealing for recrystallization after formation of the electrolytic Cu plating layer, and this compressive stress induces peeling the electroless Cu plating layer.

According to the present embodiment, because the alloy film 112 also contains Cu, the oxidation reaction indicated by the equation (8) may also occur. Further, because the alloy film 112 contains Ni, Co, or W, the oxidation reaction indicated by the above equation (6) preferentially occurs. Accordingly, peeling of the electroless Cu plating layer 113 due to H₂ eutectoid can be reduced/prevented.

Further, according to the present embodiment, the induction time at the time of forming the electroless Cu plating layer 113 is reduced. This is because relatively large protrusions and recesses are formed on the surface of the oxide film 111 and a larger quantity of metal Pd can be adsorbed on the surface of the oxide film 111.

For example, the total thickness of the alloy film 112 and the electroless Cu plating layer 113 is set to be greater than or equal to 0.1 μm and less than or equal to 1 μm. If the total thickness of these is less than 0.1 μm, there is a possibility that the oxide film 111 cannot be sufficiently coated, resulting in high sheet resistance and difficulty in electrolytic Cu plating. When the total thickness of these is greater than 1 μm, there is a possibility that voids occur at the interface between the electroless Cu plating layer 113 and the electrolytic Cu plating layer 114 after annealing for recrystallization or a decrease in adhesion due to a crystalline difference is caused.

After forming the electroless Cu plating layer 113, as illustrated in FIG. 3B, a plating resist layer 120 is formed on the electroless Cu plating layer 113. The plating resist layer 120 is provided with opening portions 121 at locations where a Cu plating layer 115 is to be formed.

Next, as illustrated in FIG. 3C, an electrolytic Cu plating layer 114 is famed in the opening portions 121 of the plating resist layer 120 by an electrolytic plating method that utilizes the electroless Cu plating layer 113 for a plating feed path. An example of an electrolytic Cu plating solution that is used to form the electrolytic Cu plating layer 114 includes the substances indicated in Table 2 below.

TABLE 2

| SUBSTANCE | CONCENTRATION |
|---|---|
| COPPER SULFATE PENTAHYDRATE | 60~250 g/L |
| SULFURIC ACID | 50~200 g/L |
| CHLORIDE ION | 5~100 mg/L |
| POLYMER | 0.01~10 g/L |
| LEVELER | 1~500 mg/L |
| BRIGHTENER | 1~2 mg/L |

For example, a non-ionic surfactant such as polyethylene glycol may be used as a polymer. For example, janus green, thiourea derivative, a phenadine compound, polyacrylamide, and polyalkylamine can be used as a leveler. For example, SPS (bis(3-sulfopropyl disulfide sodium salt)) can be used as a brightener.

In this electrolytic Cu plating process, for example, the current density is set to be 1 A/dm², and the plating time is set to be in a range of 10 minutes to 90 minutes.

After forming the electrolytic Cu plating layer 114, the plating resist layer 120 is removed as illustrated in FIG. 4A. Subsequently, using the electrolytic Cu plating layer 114 as a mask, the electroless Cu plating layer 113, the alloy film 112, and the oxide film 111 are removed by wet etching.

Thereafter, the electrolytic Cu plating layer 114 is recrystallized by annealing. In this manner, it is possible to form the Cu plating layer 115 including the electrolytic Cu plating layer 114 and the electroless Cu plating layer 113.

In this manner, the interposer 100 according to the first embodiment can be manufactured.

According to the second embodiment, from the formation of the oxide film 111 to the formation of the electroless Cu plating layer 113, high-temperature firing required for surface treatment by a sol-gel method is not required. Accordingly, it is possible to suppress transformation of the glass substrate 101 due to heating. Further, because the alloy film 112 containing Ni or the like is formed, it is possible to reduce/prevent hydrogen eutectoid at the electroless Cu plating layer 113 and reduce/prevent peeling due to hydrogen eutectoid. Further, because relatively large protrusions and recesses are formed on the surface of the oxide film 111, due to anchoring effects by the protrusions and recesses, the adhesion of the Cu plating layer 115 to the glass substrate 101 can be enhanced, and the induction time can be shortened.

Third Embodiment

Figure 8:
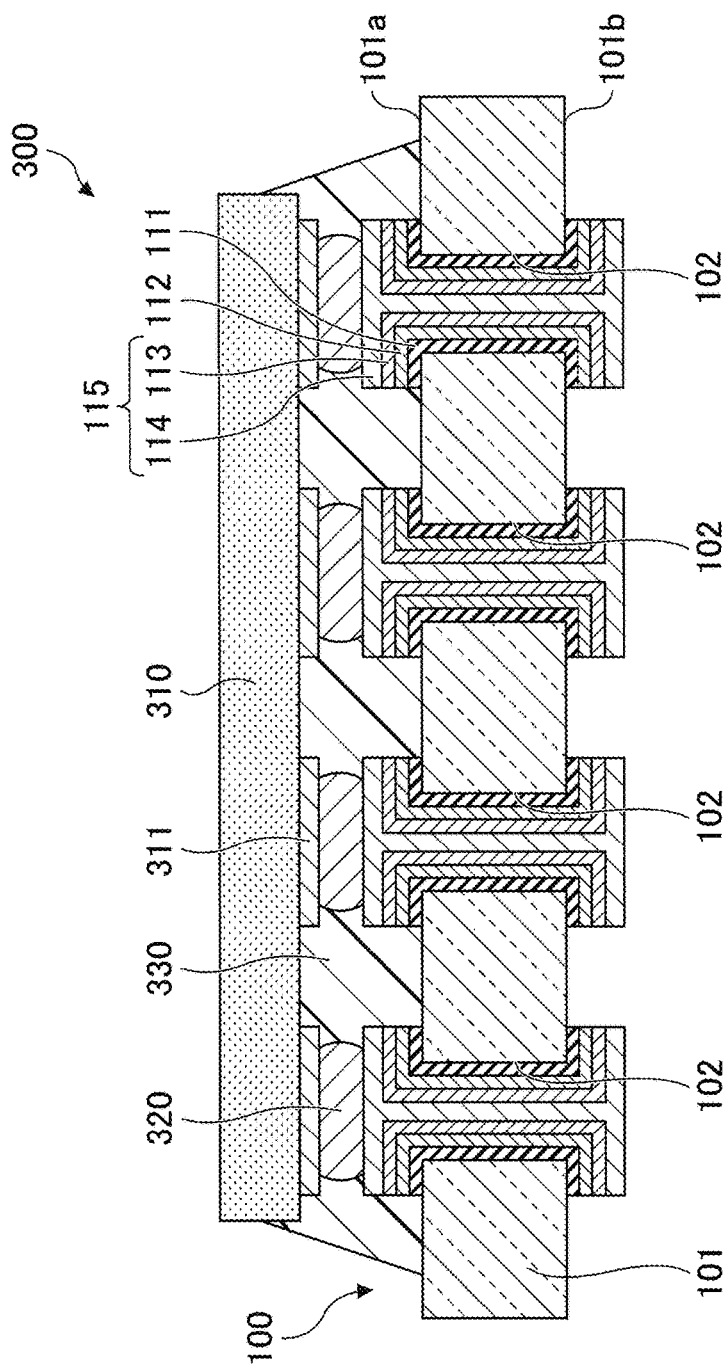
FIG. 8 is a cross-sectional view illustrating a semiconductor package according to a third embodiment.

Next, a third embodiment will be described. The third embodiment relates to a semiconductor package. FIG. 8 is a cross-sectional view illustrating a semiconductor package 300 according to the third embodiment.

As illustrated in FIG. 8, the semiconductor package 300 according to the third embodiment includes an interposer 100 according to the first embodiment, a semiconductor chip 310, bumps 320, and an underfill resin 330.

The semiconductor chip 310 includes connection terminals 311 that are connected to the Cu plating layer 115 via the bumps 320. The connection terminals 311 are, for example, electrode pads. For example, solder balls are used for the bumps 320. Examples of a material of the solder balls include lead-free solders such as tin-silver (SnAg) based alloys, tin-zinc (SnZn) based alloys, and tin-copper (SnCu) based alloys, and leaded solders of lead-tin (PbSn) based alloys. Gaps between the semiconductor chip 310 and the first surface 101a of the glass substrate 101 are filled with the underfill resin 330 such as an epoxy resin.

Figure 9:
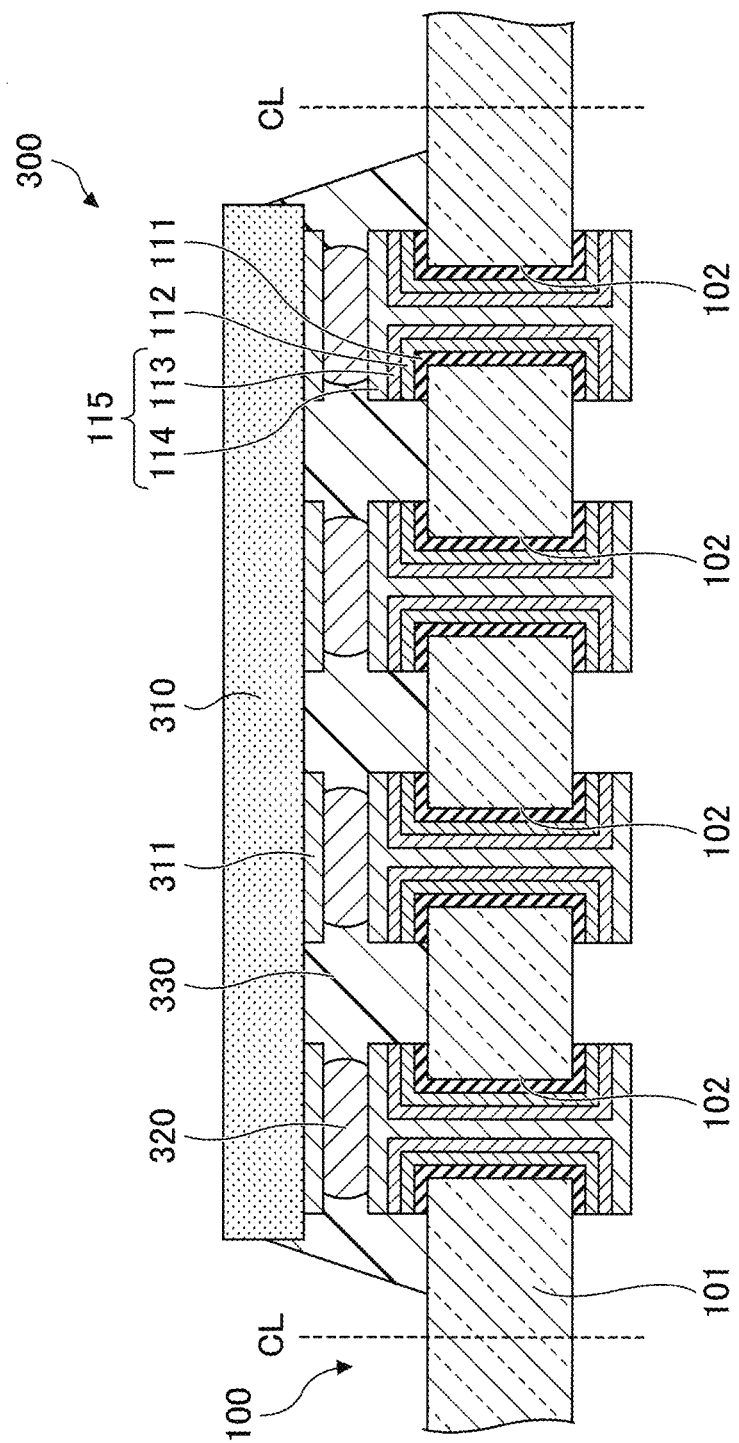
FIG. 9 is a cross-sectional view illustrating a method of manufacturing semiconductor packages according to the third embodiment.

Next, a method of manufacturing semiconductor packages 300 according to the third embodiment will be described. FIG. 9 is a cross-sectional view illustrating the method of manufacturing the semiconductor packages 300 according to the third embodiment.

First, as illustrated in FIG. 9, an interposer 100 having a plurality of interposer areas is prepared, and for each interposer area, a semiconductor chip 310 is flip-chip mounted on the interposer 100 using bumps 320. After the semiconductor chips 310 are flip-chip mounted, gaps between the semiconductor chips 310 and the interposer 100 are filled with an underfill resin 330.

Thereafter, the interposer 100 is cut by a slicer or the like along cut lines CL at the borders of the interposer areas. Thereby, a plurality of semiconductor packages 300 can be obtained using one interposer 100. In this manner, the semiconductor packages 300 according to the third embodiment can be manufactured.

Preferable Composition of Electroless Cu Plating Solution

In the present disclosure, when an alloy film 112 is formed, a desired object can be achieved. Also, when a more suitable alloy film 112 is formed, better effects can be obtained. Accordingly, in order to elucidate the conditions for being able to form a more suitable alloy film 112, the inventor of the present invention has conducted experiments on the relationship between the concentration of nickel (II) sulfate hexahydrate in an electroless Cu plating solution and adhesion.

In the experiments, with respect to the electroless Cu plating solution indicated by Table 1, only the concentration of nickel (II) sulfate hexahydrate was changed, the concentrations of the other substances were fixed to constant values, and electroless Cu plating layers were formed. Then, for each of the conditions No. 1 to No. 6, the adhesion between the electroless Cu plating layer and the substrate was evaluated, and the concentration of Ni in the alloy film and the electroless Cu plating layer was measured. These results are indicated by Table 3. In the column of adhesion of Table 3, A indicates excellent, B indicates very good, C indicates good, and D indicates poor.

TABLE 3

| CONDITION No. | CONCENTRATION OF NICKEL (II) SULFATE HEXAHYDRATE (g/L) | CONCENTRATION OF NICKEL (% BY MASS) | ADHESION |
| --- | --- | --- | --- |
| 1 | 0.0 | 0.0 | D |
| 2 | 0.4 | 0.6 | C |
| 3 | 0.6 | 1.2 | B |
| 4 | 1.0 | 2.2 | A |
| 5 | 1.5 | 3.1 | A |
| 6 | 3.0 | 5.1 | B |

As indicated in Table 3, in the conditions No. 2 to No. 6 in which the electroless Cu plating solution includes nickel (II) sulfate hexahydrate, the obtained adhesion was good, very good, or excellent. From the results indicated in Table 3, the concentration of nickel (II) sulfate hexahydrate in the electroless Cu plating solution is preferably greater than or equal to 0.5 g/L and less than or equal to 3.0 g/L, and is more preferably greater than or equal to 0.8 g/L and less than or equal to 2.5 g/L. Further, from the results indicated in Table 3, the concentration of Ni in the alloy film and the electroless Cu plating layer is preferably greater than or equal to 1.0% and less than or equal to 5.1% by mass, and is more preferably greater than or equal to 2.0% by mass and less than or equal to 4.0% by mass.

Electron Microscope Observation

Figure 10:
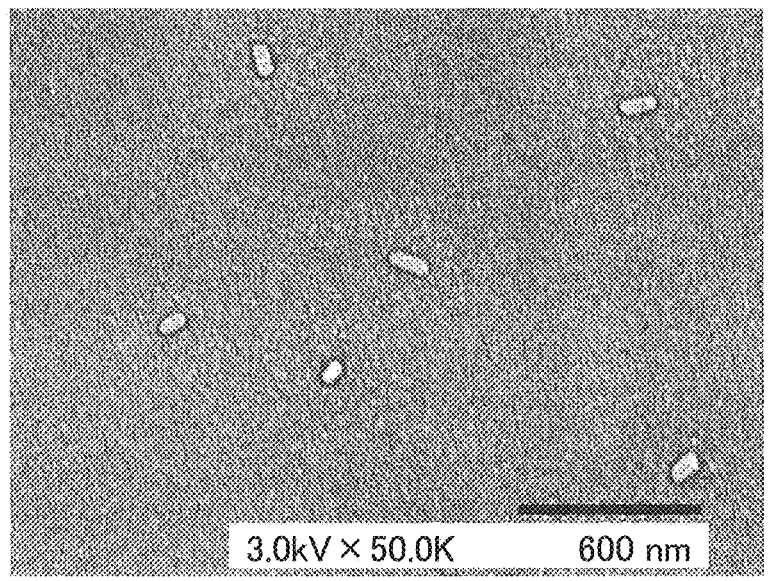
FIG. 10 is a view illustrating an SEM image of a surface of a glass substrate.
Figure 11:
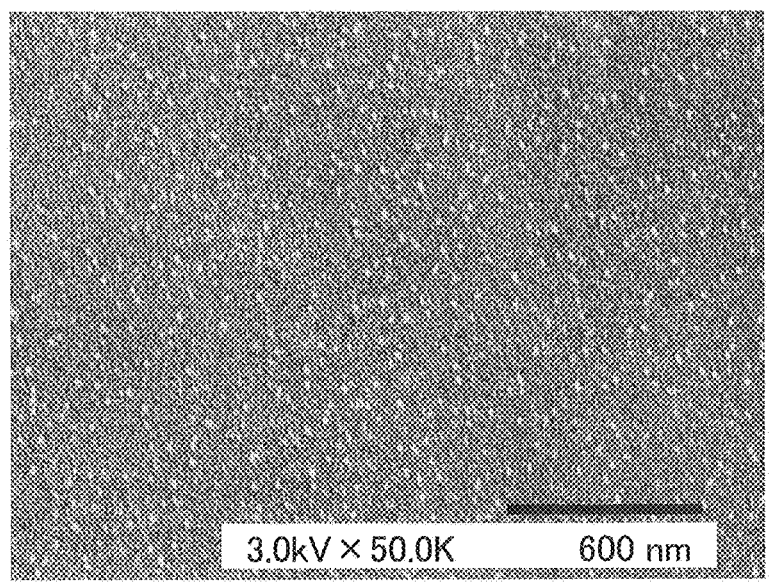
FIG. 11 is a diagram illustrating an SEM image of a surface of an oxide film.
Figure 12:
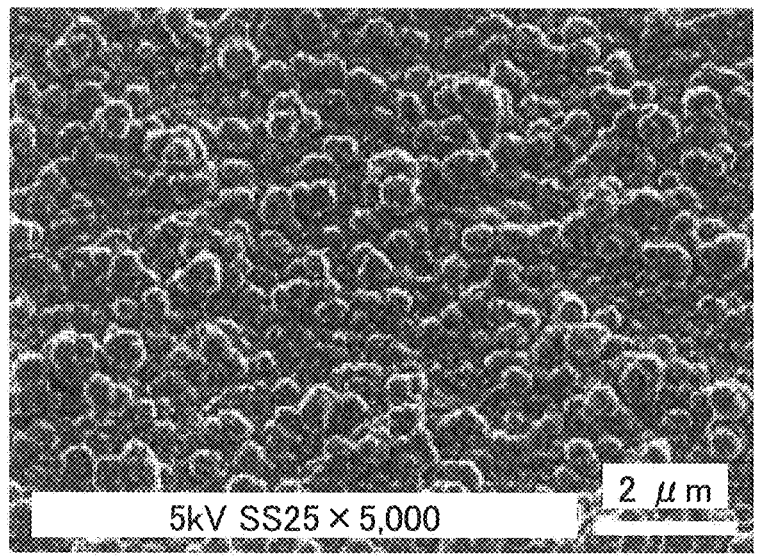
FIG. 12 is a diagram illustrating an SEM image of a surface of an electroless Cu plating layer.
Figure 13:
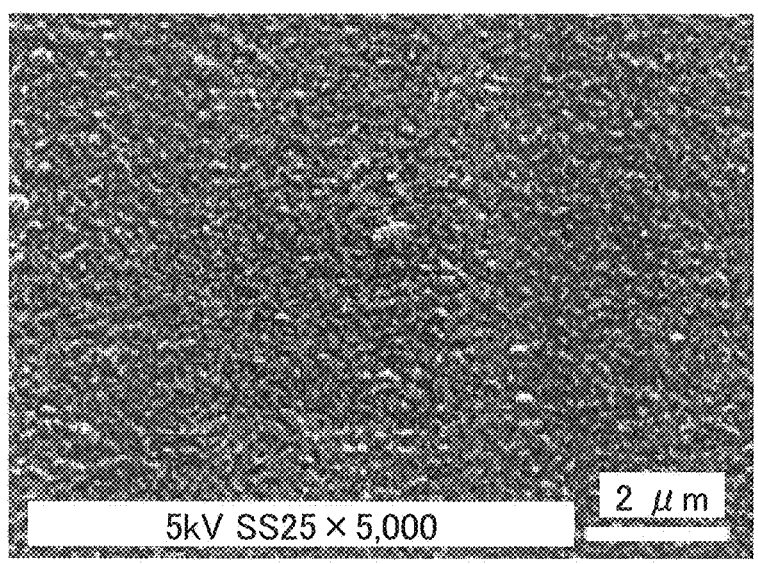
FIG. 13 is a diagram illustrating an SEM image of a surface of an electroless Cu plating layer in a reference example.

The inventor of the present invention has formed an electroless Cu plating layer by a method according to the second embodiment and performed electron microscope observation at various stages. FIG. 10 is a diagram illustrating a scanning electron microscope (SEM) image of a surface of a glass substrate, FIG. 11 is a diagram illustrating an SEM image of a surface of an oxide film, and FIG. 12 is a diagram illustrating an SEM image of a surface of an electroless Cu plating layer. FIG. 13 is a diagram illustrating an SEM image of a surface of an electroless Cu plating layer in a reference example. In the reference example, the electroless Cu plating layer was formed on a glass substrate without forming an oxide film.

As illustrated in FIG. 10, although the flatness of the surface of the glass substrate is high, protrusions and recesses are formed on the surface of the oxide film as illustrated in FIG. 11. Also, as illustrated in FIG. 12, on the surface of the electroless Cu plating layer formed according to the second embodiment, large protrusions and recesses are formed. The appearance of this electroless Cu plating layer was matte. Conversely, as illustrated in FIG. 13, the flatness of the surface of the electroless Cu plating layer, which was formed without forming an oxide film, was high, and the appearance of the electroless Cu plating layer exhibited a metallic lustre. Note that although the induction time was three minutes in the reference example, the induction time in the method according to the second embodiment was thirty seconds, which is one-sixth of that of the reference example.

Various aspects of the subject-matter described herein may be set out non-exhaustively in the following numbered clauses:

1. A method of manufacturing a wiring substrate, the method comprising:

using an organometallic complex of one or both of Ti and Zr to form, on a surface of a substrate, an oxide film including an oxide of one or both of Ti and Zr;

using an electroless Cu plating solution including one or any combination of Ni, Co, and W to form, on the oxide film, an alloy film including an alloy of one or any combination of Ni, Co, and W with Cu;

forming an electroless Cu plating layer on the alloy film; and forming an electrolytic Cu plating layer on the electroless Cu plating layer.

2. The method of clause 1, wherein a glass substrate is used as the substrate.

3. The method of clause 1, wherein a through hole is formed in the substrate.

4. The method of clause 3, wherein the oxide film, the alloy film, the electroless Cu plating layer, and the electrolytic Cu plating layer are formed from a side surface of the through hole to a first surface of the substrate and a second surface opposite the first surface.

Although the preferred embodiments and the like have been described above in detail, the present invention is not limited to the embodiments and the like described above, and various variations and substitutions may be made for the embodiments and the like described above without departing from the scope of the present invention. For example, a silicon (Si) substrate may be used instead of a glass substrate.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A wiring substrate comprising:
   a substrate;
   an oxide film including an oxide of one or both of titanium (Ti) and zirconium (Zr), the oxide film being formed on a surface of the substrate;
   an alloy film including an alloy of one or any combination of nickel (Ni), cobalt (Co) and tungsten (W) with copper (Cu), the alloy film being formed on the oxide film; and
   a Cu layer formed on the alloy film,
   wherein the substrate, the oxide film, the alloy film, and the Cu layer are layered in this order.

2. The wiring substrate according to claim 1, wherein the substrate is a glass substrate.

3. The wiring substrate according to claim 1, wherein a through hole is formed in the substrate.

4. The wiring substrate according to claim 3, wherein the oxide film, the alloy film, and the Cu layer are formed from a side surface of the through hole to a first surface of the substrate and a second surface opposite the first surface.

5. A semiconductor package comprising:
   the wiring substrate according to claim 1; and
   a semiconductor chip mounted on the wiring substrate,
   wherein the semiconductor chip includes a connection terminal connected to the Cu layer.

6. The wiring substrate according to claim 1,
   wherein the Cu layer includes a first plated Cu layer and a second plated Cu layer on the first plated Cu layer wherein a total thickness of the alloy film and the first plated Cu layer is greater than or equal to 0.1 µm and less than or equal to 1 µm, and
   wherein a thickness of the oxide film is greater than or equal to 5 nm and less than or equal to 50 nm.

* * * * *